(12) United States Patent
Oguro et al.

(10) Patent No.: US 9,231,177 B2
(45) Date of Patent: Jan. 5, 2016

(54) LIGHT EMITTING DEVICE

(71) Applicant: NICHIA CORPORATION, Anan-shi, Tokushima (JP)

(72) Inventors: Hiroki Oguro, Komatsushima (JP); Motokazu Yamada, Tokushima (JP); Yasuo Fujikawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/317,008

(22) Filed: Jun. 27, 2014

(65) Prior Publication Data

US 2015/0001564 A1 Jan. 1, 2015

(30) Foreign Application Priority Data

Jul. 1, 2013 (JP) .................................. 2013-137693

(51) Int. Cl.
| | |
|---|---|
| *H01L 33/00* | (2010.01) |
| *H01L 33/60* | (2010.01) |
| *H01L 33/50* | (2010.01) |
| *H01L 33/48* | (2010.01) |

(52) U.S. Cl.
CPC ................ *H01L 33/60* (2013.01); *H01L 33/48* (2013.01); *H01L 33/50* (2013.01); *H01L 33/505* (2013.01)

(58) Field of Classification Search
USPC ........................................................ 257/98
See application file for complete search history.

(56) References Cited

U.S. PATENT DOCUMENTS

| | | | | |
|---|---|---|---|---|
| 2004/0004424 | A1* | 1/2004 | Sakurai .......................... | 313/110 |
| 2006/0186803 | A1* | 8/2006 | Lim et al. ...................... | 313/506 |
| 2007/0177380 | A1 | 8/2007 | Schultz et al. | |
| 2007/0285740 | A1* | 12/2007 | Onishi et al. .................. | 358/475 |
| 2009/0273925 | A1 | 11/2009 | Schultz et al. | |
| 2011/0260184 | A1 | 10/2011 | Furuyama | |
| 2015/0115139 | A1* | 4/2015 | Okushiba ...................... | 250/216 |

FOREIGN PATENT DOCUMENTS

| | | | |
|---|---|---|---|
| EP | 1605028 A1 | 12/2005 | |
| EP | 2482346 A1 | 8/2012 | |
| EP | 2535954 A1 | 12/2012 | |
| JP | 2007-243226 A | 9/2007 | |
| JP | 2009-525614 A | 7/2009 | |
| JP | 2010-109119 A | 5/2010 | |
| JP | 2012044102 A | * 3/2012 | |
| JP | 2013-084803 A | 5/2013 | |

OTHER PUBLICATIONS

Extended European Search Report of the corresponding European Application No. 14174704.8, dated Nov. 5, 2014.

* cited by examiner

*Primary Examiner* — Telly Green
(74) *Attorney, Agent, or Firm* — Global IP Counselors, LLP

(57) ABSTRACT

Provided is a light emitting device in which deterioration of the substrate member can be reduced. The light emitting device includes a base member mainly made of a resin, a plurality of wiring portions and arranged on the base member via an adhesive agent, a groove portion defined between adjacent wiring portions, and at least one light emitting element which is disposed straddling at least a part of the groove portion. The adhesive agent is applied covering the base member from the groove portion, and contains a light-shielding member. The light-shielding member shields the base member from light, for example at a specific wavelength, emitted from the at least one light emitting element.

12 Claims, 3 Drawing Sheets

LIGHT EMITTING DEVICE

CROSS-REFERENCE TO RELATED APPLICATION

This application claims priority to Japanese Patent Application No. 2013-137693, filed on Jul. 1, 2013. The entire disclosure of Japanese Patent Application No. 2013-137693 is hereby incorporated herein by reference.

BACKGROUND

1. Technical Field

The present disclosure relates to a light emitting device.

2. Background Art

There has been proposed a light emitting device which includes a plurality of light emitting elements arranged on a flexible substrate member which uses a resin material (see Patent Literature 1: JP2005-322937A). In the light emitting device disclosed in JP2005-322937A, the light emitting elements are connected in a flip-chip configuration via bumps or the like to conductive regions formed on a polyimide substrate member.

SUMMARY

According to the present invention, the problems described above can be solved by the structure described below. A light emitting device according to the embodiments includes a base member mainly made of a resin, a plurality of wiring portions arranged on the base member via an adhesive agent, a groove portion defined between adjacent wiring portions, and a light emitting element which is disposed straddling at least a part of the groove portion. The adhesive agent is applied covering the base member from the groove portion, and contains a light-shielding member. The light-shielding member shields the base member from light, for example at a specific wavelength, emitted from the at least one light emitting element.

DETAILED DESCRIPTION OF EMBODIMENTS

Next, embodiments of the invention will be described with reference to the drawings. In the description of the drawings below, the same or similar components are denoted by the same or similar reference symbols. However, it should be noted that the drawings are drawn schematically, and the dimensional ratios and the like of the components may differ from the actual ratios. Accordingly, the specific dimension and the like should be determined in consideration of the description below. In addition, it is needless to say that the drawings may also include the components that have different dimensional relations and ratios among one another.

It will be apparent to those skilled in the art from this disclosure that the following descriptions of the embodiments are provided for illustration only and not for the purpose of limiting the invention as defined by the appended claims and their equivalents.

Structure of Light Emitting Device 100

Figure 1:
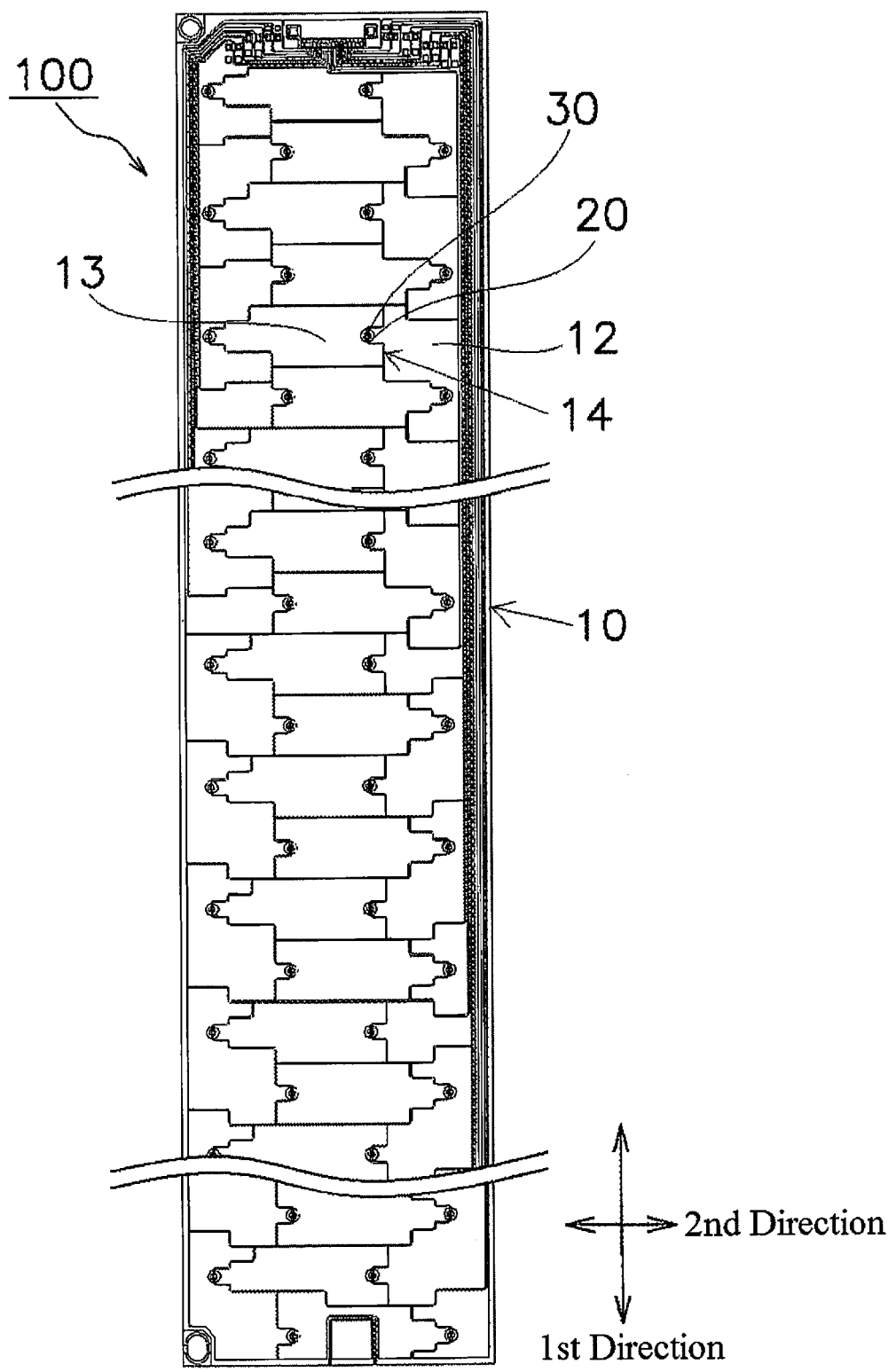
FIG. 1 is a plan view of a light emitting device.
Figure 2:
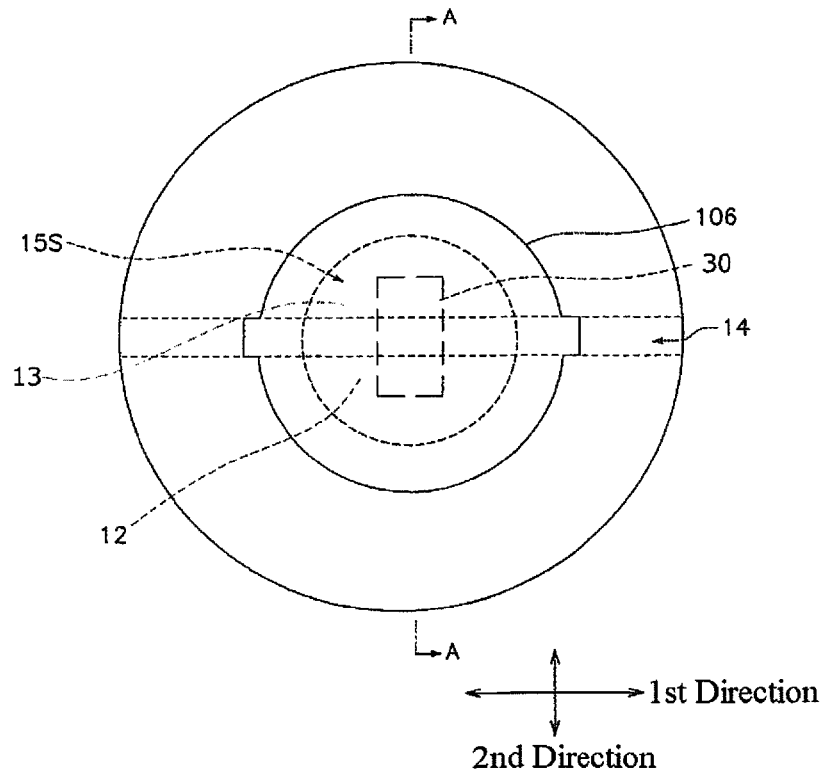
FIG. 2 is an enlarged plan view near a light emitting element shown in FIG. 1.
Figure 3:
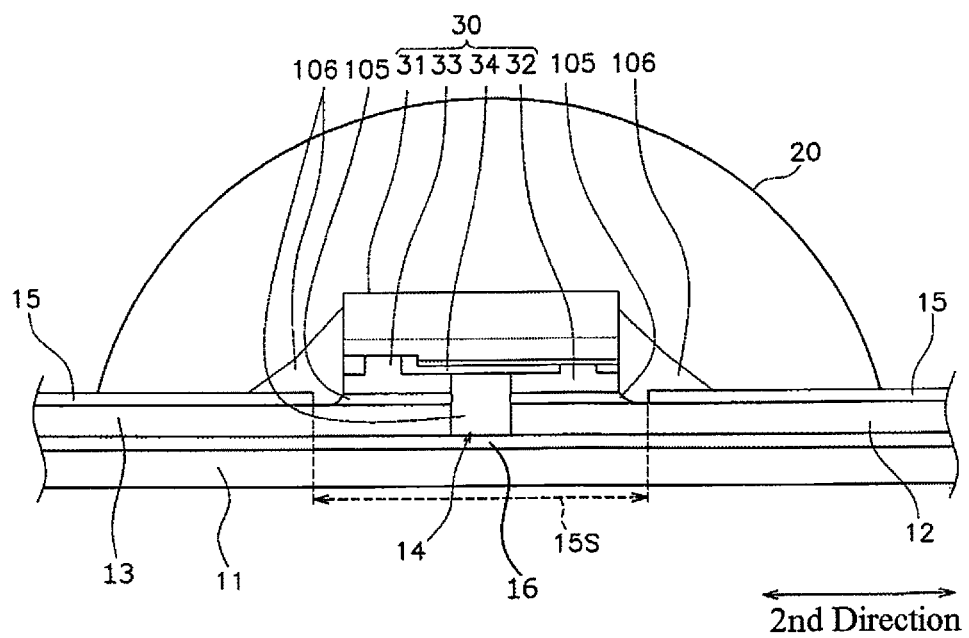
FIG. 3 is a cross sectional view taken along line A-A of FIG. 2.

A structure of a light emitting device 100 according to an embodiment will be described with reference to the drawings. FIG. 1 is a plan view showing a structure of a light emitting device 100. FIG. 2 is an enlarged plan view near a light emitting element 30 shown in FIG. 1. FIG. 3 is a cross sectional view taken along line A-A of FIG. 2.

The light emitting device 100 includes a substrate member 10, a plurality of sealing members 20, and a plurality of light emitting elements 30. The light emitting device 100 is flexible, so that it can be stored rolled-up on a reel etc., and can be installed along a curved surface.

1. Structure of Substrate Member 10

In the present embodiment, the substrate member 10 of is an elongated member. The first direction corresponds to the longitudinal direction of the substrate member 10 and the second direction which is substantially perpendicular to the first direction corresponds to the lateral direction of the substrate member 10. The ratio of the lengths of the substrate member 10 in the longitudinal direction and the lateral direction can be appropriately adjusted, for example, to be 6:1, 30:1, or 100:1. The length of the substrate member 10 in the first direction can be, for example, 1150 mm, and the length of the substrate member 10 in the second direction can be, for example, 15 mm. The substrate member 10 includes a flexible base member 11, at least one wiring portion 12, at least one wiring portion 13, a groove portion 14 defined between ones of the wiring portion 12 and wiring portion 13 which are adjacent and spaced apart from each other, a reflecting layer 15, and an adhesive agent 16 which connects the base member 11 and the wiring portions 12, 13.

The base member 11 is made of a flexible insulating material. For such a material, an insulating resin such as polyimide (PI), polyethylene naphthalate (PEN), and polyethylene terephthalate (PET) can be preferably used but is not limited thereto. For example, the base member 11 may be made of a strip of copper foil or aluminum foil which is covered with an insulating resin. The base member 11 can have a thickness of about 10 μm to about 100 μm, for example. The material of the base member 11 can be appropriately selected in view of the type of mounting of the light emitting elements 30, the reflectance, and adhesion with other members, etc. For example, in the case where a solder is used for mounting the light emitting elements 30, a polyimide which has a high heat resisting property is preferably used, and in the case where the reflecting layer 15 which to be described below is not disposed on the substrate 11, a material which has a high optical reflectance (for example a white color material) is preferably used so that a light emitting device with good light extraction efficiency can be obtained.

In the case where the base member 11 is made solely of a resin, the substrate member 11 may be particularly prone to deterioration due to light, and thus, the effects of the present invention can be exhibited effectively.

The wiring portions 12 and 13 are arranged on a main surface of the base member 11. The wiring portions 12 and 13 are arranged spaced apart from each other. With this arrangement, the groove portion 14 to be described below is defined between the wiring portions 12 and 13. The wiring portions 12 and 13 as described above are made of a thin metal film such as a copper foil or an aluminum foil, for example. The wiring portions 12 and 13 have a thickness which does not impair the flexibility of the substrate member 10 and a thickness of 8 μm to 150 μm is preferable. The wiring portions 12 and 13 are preferably arranged on the base member 11 respectively with a largest possible area. An increase in the surface area of the wiring portions 12 and 13 allows for increased heat dissipation from the wiring portions 12 and 13. The corners of the wiring portions 12 and 13 in a plan view are preferably rounded for improving the adhesion (anti-detachment feature) of the wiring portions, which can enhance the reliability. The corners are preferably rounded with a radius of 100 μm or more.

The groove portion 14 is defined between the wiring portions 12 and 13 which are spaced apart from each other, so that the shape of the groove portion is in conformity to the shapes of the wiring portions, which may be, for example, a crank shape. The width defining the groove portions 14 is preferably narrower than the width of the wiring portions 12 and 13, and, for example, can be about 0.05 mm to about 5 mm. As described above, on one surface of the base member, the plurality of wiring portions 12, 13 are spaced apart from each other and the separation creates the groove portion where the wiring portions are not disposed (i.e., the portion where the base member and the adhesion layer are not covered with the wiring portions).

The wiring portions 12 and 13 are respectively arranged on the base member 11 via the adhesive agent 16. The adhesive agent is, for example, made of a resin such as an epoxy-based resin, an imide-based resin, an amide-based resin, an acrylic-based resin, a silicone-based resin. The adhesive agent 16 preferably has a thickness of 1 μm to 50 μm. The adhesive agent 16 is configured to adhere the wiring portions 12, 13 and the base member 11 respectively, and is applied not only between the wiring portions and the base member, but also is extended to cover the groove portion 14 which is a region where the wiring portions 12, 13 are not arranged. Inclusion of a light-shielding member in the adhesive agent 16 so that light, which is of at least a specific wavelength, emitted from the light emitting elements 30 can be absorbed or shielded by the light-shielding member. That is, inclusion of a light-shielding member, which can shield a part or all of the light from the light emitting elements 30, in the adhesive agent 16 allows for shielding the light irradiated on the base member 11. Thus, deterioration of the base member 11 due to light can be reduced. In the light emitting device described in JP 2005-322937A, the polyimide substrate member is exposed in a region which does not have the electrically conductive region, and irradiation of light from the light emitting element on the exposed region may result in deterioration of the polyimide. Particularly, in a flexible substrate member such as a polyimide substrate member with a small thickness of about several tens of micrometers, deterioration of the exposed region which has to be formed near the light emitting element poses a problem. Deterioration of the polyimide substrate member due to discoloration and/or degradation of strength may adversely affect the withstand voltage. The present embodiment can provide a light emitting device in which degradation of the substrate member can be reduced.

The light-shielding member is preferably at least one selected from the group consisting of a light-absorption materials, wavelength converting materials, and light-reflecting materials. More specific examples of the light-absorption materials include carbon black, pigments, and colorants. The light-reflecting material is to exhibit light-diffusing effect by employing a difference in the refractive index with the adhesive material, and for example, a while filler such as $SiO_2$, $TiO_2$, $Al_2O_3$, $ZrO_2$, $MgO$, or $BaSO_4$; or pores of submicron sizes can be used. Also, interference or a mirror material with the use of a metal layer can be used. The wavelength converting material is to absorb light, which is of at least a specific wavelength, emitted from the light emitting elements 30 and to convert the absorbed light to light of a different wavelength. For example, the wavelength converting material is to convert the emission wavelength of the light emitting elements 30 into a wavelength which hardly degrade the base member 11. More specifically, an oxide-based fluorescent material, a nitride-based fluorescent material, and/or a sulfide-based material can be preferably used as the wavelength converting material.

The size and shape of the light-shading member are not specifically limited. For example, a spherical shape, a scale-like shape, or a needle-like shape with a size of 1 nm to 50 μm can be used.

Also, two or more materials as described above can be used in combination. For example, with the use of a combination of a light-reflecting material and a light-absorption material, the light from the light emitting elements can be diffused by the light-reflecting material to increase the optical path length which can increase the probability of light to hit the light-absorption material. Thus, the usage amount of the light-absorption material can be reduced. Carbon black which can be suitably used as the light-absorption material has electrical conductivity. So that a reduction in the use of carbon black can increase electrical insulation and thus preferable.

The adhesive agent 16 preferably contains the light-shielding member in a range of 0.01 to 60 weight % with respect to the weight of the adhesive agent 16. More specifically, for example, 0.005 to 10 weight %, preferably 0.01 to 5 weight % of the light-absorption material, 1 to 50 weight %, preferably 2 to 40 weight % of the wavelength converting material, and/or 1 to 100 weight %, preferably 2.5 to 50 weight % of the light-reflecting material may be employed.

In the case where two or more of those are used in combination, smaller amounts within the ranges shown above are preferably employed.

The adhesive agent 16 preferably has a lower light transmissive rate than the resin layer 106 to be described below, to the light from the light emitting elements 30. With this arrangement, light which is transmitting through the resin layer 106 can be shielded.

The reflective layer 15 covers the surfaces of the base member 11 and the wiring portions 12, 13. The reflective layer 15 also covers the groove portion 14. Thus, the reflective layer 15 covers approximately the entire upper surface of the substrate 10 except for the opening portions 15S to be described below. Such a reflective layer 15 is made of a material which can reflect the emitted light (including the wavelength-converted light by a wavelength converting member) from the at least one light emitting element 30. For such a material, an insulating white ink which is referred to as "a white resist" made of a silicone resin containing titanium oxide is preferably used but is not limited thereto.

Also, openings 15S are defined in the reflecting layer 15 at least in and around the regions where the light emitting elements 30 to be arranged respectively. FIG. 2 and FIG. 3 show one of the openings 15S formed over the two wiring portions 12 and 13. As shown in FIG. 2 and FIG. 3, in the opening 15S, the two wiring portions 12 and 13 and the groove portion 14 are partially exposed.

The openings 15S can be formed in an appropriate shape such as a circular shape or a quadrangular shape adapted to surround the light emitting elements 30 in a plan view, respectively. After the light emitting elements 30 are mounted, the openings 15S are preferably covered with a resin layer 106 (an underfill material), a sealing member 20, and/or other appropriate light-reflecting member. With this arrangement, each of the portion around the respective light emitting elements 30 can be protected. Also, the use of a material having a higher optical reflectance than that of the substrate member 10 and the wiring portions 12 and 13 which are exposed in the each opening 15S for the covering can improve the light extraction efficiency of the light emitting device.

Also, the reflecting layer 15 may be disposed extending below the light emitting elements 30 with the openings 15S smaller than the shape in a plan view of the light emitting elements 30. The reflecting layer 15 may be disposed to surround the bonding member of each light emitting element, so that the opening is not substantially formed. In this case, the light extraction efficiency of the light emitting device can be enhanced without using a material such as an underfill material to be described below. In the case where the groove portion 14 is entirely covered with the reflecting layer 15, the light from the light emitting elements 30 can be prevented from irradiating on the base member 11. But a certain amount of light is supposed to be transmitted depending on the thickness of the reflecting layer 15. Thus, even in the case where the groove portion 14 is completely covered with the reflecting layer 15, disposing of a light-shielding member allows for shielding of light which transmits through the reflecting layer 15.

The wiring portions 12, 13 also serve as the terminal portions which are connected to external wirings to be connected to an external power source. The terminal portions are preferably formed at an end portion at the main surface-side of the base member 11, and the external wirings may be connected to publicly known connectors disposed on the substrate member 10.

2. Structure of Sealing Member 20

In the present embodiment, sealing members 20 are arranged on the substrate member 10. The sealing members 20 are disposed so as to respectively enclose the openings 15S defined in the reflecting layer 15. Each of the sealing members 20 seals one light emitting element 30. The sealing members 20 are, as shown in FIG. 3, respectively formed in a hemisphere shape with one light emitting element 30 at the center, but is not limited thereto, and may be formed in an appropriate shape such as a rectangular parallelepiped shape or a semicylindrical shape.

Such sealing members 20 are made up of a light transmissive resin (for example, an epoxy resin, a urea resin, a silicone resin, etc.). The sealing members 20 may contain a light-scattering agent (barium sulfate, titanium oxide, aluminum oxide, silicon oxide, etc.).

The material of the sealing members 20 is not limited to a resin material such as described above, and a light transmissive glass or the like may be employed.

The sealing members 20 preferably contain a wavelength converting member which can absorb emission from the light emitting elements 30 and emits light of a different wavelength. With this arrangement, a light emitting device to emit light of a desired color can be obtained. Examples of such a wavelength converting member include an oxide-based fluorescent material, a sulfide-based fluorescent material, and a nitride-based fluorescent material. It is preferable that, particularly with the use of a gallium nitride-based light emitting element to emit blue light as the light emitting elements 30, a fluorescent material to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. With this arrangement, a light emitting device to emit white light can be obtained.

More specifically, for the light emitting devices used for the display devices such as backlights of liquid crystal displays and TV-screens, a SiAlON-based fluorescent material and a SCASN-based fluorescent material are preferably used singly or in combination. With this arrangement, a light emitting device having high color reproductivity can be obtained. Also, in a light emitting device for lighting applications, a YAG-based fluorescent material or a LAG-based fluorescent material and a SCASN-based fluorescent material or a CASN-based fluorescent material are preferably used in combination. With this arrangement, a light emitting device having high color rendering properties can be realized.

The use of the wavelength converting member as described above is not limited to be contained in the sealing member 20, but can be used external of the light emitting device 100, for example, disposed in a display device or a lighting device which uses the light emitting device 100 as its light source.

3. Structure of Light Emitting Element

In the present embodiment, the at least one light emitting element 30 is disposed on the substrate member 10. The light emitting elements 30 are respectively disposed in the openings 15S formed in the reflective layer 15. The light emitting elements 30 are respectively connected to the wiring portions 12 and 13. As shown in FIG. 2, each light emitting element 30 is arranged so as to straddle at least a part of the groove portion 14, and the longitudinal direction of each light emitting element 30 can be substantially in parallel with the second direction.

In the embodiment, each of the light emitting elements 30 is, as shown in FIG. 3, mounted on the substrate member 10 in a flip-chip manner. Each light emitting element 30 is connected to the wiring portions 12, 13 via a pair of bonding members 105 respectively. The bonding member 105 can be made of, for example, a solder such as Sn—Ag—Cu system, Au—Sn system, or a Sn—Cu system, a metal such as Au, an anisotropic conductive paste, or an Ag paste. A resin layer 106 (an underfill material) is filled between the light emitting element 30 and the base member 11. The resin layer 106 is, as shown in FIG. 3, preferably disposed not only on the wiring portions 12, 13 but also on the reflecting layer 15. With this arrangement, the light extraction efficiency can be enhanced and also the light emitting elements 30 can be supported firmly. The resin layer 106 can be made of, for example, a silicone resin or an epoxy resin, a fluororesin, or a hybrid resin containing one or more those resins.

The resin layer 106 preferably has a light reflecting property by containing a material having a white color such as titanium oxide, silicon oxide, or alumina. With this arrangement, the light extraction efficiency of the light emitting elements can be increased. Also in this case the resin layer 106 is supposed to allow a certain amount of light to transmit therethrough, so that providing the light-shielding member allows for shielding of light which is transmitting through the resin layer 106.

Also, the light emitting elements 30 respectively include a semiconductor structure 31, a p-side electrode 32, an n-side electrode 33, and an insulating layer 34, as shown in FIG. 3. The semiconductor structure 31 includes an n-type layer, an active layer, and a p-type layer which are stacked in the order on a light-transmissive sapphire substrate. The n-type layer, the active layer and the p-type layers can be respectively made of, for example, a gallium nitride-based semiconductor. The p-side electrode 32 and the n-side electrode 33 are respectively connected to a pair of wiring portions 12 and 13 via a pair of bonding members 105. The n-side electrode 33 is extended to a lower portion of the p-type layer via the insulating material layer 34. The p-side electrode 32 and the n-side electrode 33 are disposed so that the portions facing each other can be in parallel with each other. This arrangement facilitates disposition (mounting) over the groove portion 14. The p-side electrode 32 and the n-side electrode 33 preferably have approximately same size and shape. With this arrangement, the stress experienced on the light emitting elements 30 caused by bending of the substrate member 10 can be dispersed, so that malfunction of the light emitting elements 30 can be reduced.

The light emitting device 100 as described above employs the flexible substrate member 10, so that a roll-to-roll processing method can be used for manufacturing.

Other Embodiments

The present invention is described with reference to the embodiment illustrated in the accompanying drawings. It should be understood, however, that the description and the drawings are intended as illustrative of the present invention, and the scope of the present invention is not limited to those described above. Various alternate embodiments, examples, and operational technologies will become apparent to one skilled in the art, from the description provided herein.

(1) In the above embodiment, the substrate member 10 includes wiring portions 12 and 13, but is not limited thereto. The substrate member 10 may include three or more wiring portions. In this case, the plurality of wiring portions may be arranged in the second direction. Also, in this case, each of the light emitting elements 30 and the corresponding sealing member 20 may be arranged over three or more wiring portions.

(2) In the above embodiment, one light emitting element 30 is connected to the wiring portions 12 and 13, but two or more light emitting elements 30 may be connected to the wiring portions 12 and 13.

(3) In the above embodiment, one sealing member 20 seals one light emitting element 30, but one sealing member 20 may seal two or more light emitting elements 30.

(4) In the above embodiment, a planar shape of the wiring portions 12 and 13 is shown in FIG. 1 for purposes of illustration and not limitation. The planar shape of the wiring portions 12 and 13 may be changed appropriately according to the size of the substrate member 10 and/or to the number of the light emitting element 30 to be used.

(5) In the above embodiment, the groove portion 14 may have a shape which is a combination of linear groove parts, but is not limited thereto. At least a part of the groove portion 14 may be formed with a curved shape, a wavy shape, or the like.

(6) In the above embodiment, the light emitting elements 30 are mounted in a flip-chip manner, but is not limited thereto. For example, the light emitting elements 30 may be mounted by using die bonding or wire bonding technology.

Figure 4:
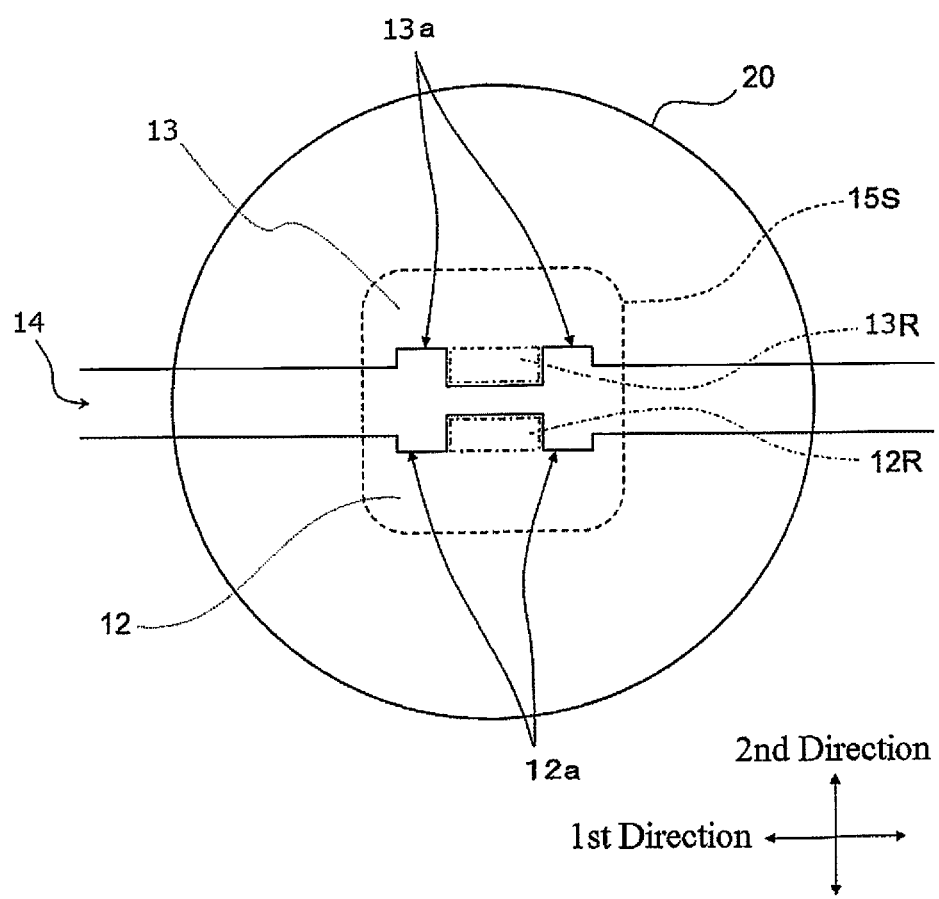
FIG. 4 is an enlarged plan view of wiring portions around a pair of connecting regions.

(7) Although specifically described in the above-described embodiment, the wiring portions 12, 13 may be provided with a pattern for self-alignment of the light emitting element 30. More specifically, as shown in the planar view in FIG. 4, each of the pair of wiring portions 12 and 13 may have a pair of recessed portions 12$a$ and 13$a$. The bonding member 105 which connects the light emitting element 30 with a pair of wiring portions 12 and 13 is disposed in the connecting region 12R and 13R formed in between the pair of recessed portions 12$a$ and 13$a$. Thus, the bonding member 105 is held between the pair of recessed portions 12$a$ and 13$a$ which allows self alignment of the light emitting elements 30 at respective predetermined positions. The bonding regions 12R and 13R preferably have a width approximate to the shape of the electrodes of the corresponding light emitting elements 30, and more preferably have a size approximate to the size of the electrodes. With the arrangement described above, preferable self-alignment of the light emitting elements 30 can be achieved.

(8) In the above embodiment, the plurality of light emitting elements 30 are connected in series, but the connection is not limited to this, an appropriate connection such as parallel connection, series connection, or the like, can be employed.

(9) The light emitting elements 30 may be so-called bare chips as described above, but chips in which a layer including a wavelength converting member, and/or a light-reflecting layer, etc. is previously disposed around such bare chips can also be used.

EXAMPLES

The base member 11 and the wiring portions 12 and 13 are adhered with an adhesive agent 16, using a polyimide sheet with a thickness of 25 µm for the base member 11 and Cu with a thickness of 35 µm for the wiring portions 12 and 13. With the use of a thermosetting epoxy-based adhesive material which contains 3 wt % of carbon black as a light-shielding member, the sheet is formed with a thickness of about 10 µm. The light emitting elements 30 ($\lambda d$=450 nm) of a four sided shape in a plan view with sides of 600 µm are mounted on the substrate member 10 in a flip-chip manner with the use of a SnCu solder as the bonding member 105. Then, a resin layer 106 is formed around the light emitting elements 30 with applying an underfill material of a silicone resin which includes a 30 wt % of titanium oxide having an average diameter of 0.25 µm. Then, as a sealing member 20, a silicone resin is disposed in a dome shape as the sealing member 20. The light emitting device fabricated as described above can reduce the amount of light irradiated on the polyimide sheet and allows little light to leak to the backside of the base member 10. The wavelength of light that causes decomposition of C—N bonding portions in the imide groups which are included in the polyimide is 448.9 nm. Thus, in the case where employing a light emitting element with the emission wavelength of about 450 nm.

It should be obvious that various other embodiments are possible without departing the spirit and scope of the present invention. Accordingly, the scope and spirit of the present invention should be limited only by the following claims.

What is claimed is:

1. A light emitting device comprising:
   a base member including a resin;
   a plurality of wiring portions adhered to the base member with an adhesive agent;
   a groove portion defined between adjacent wiring portions;
   the adhesive agent including a light-shielding member, disposed between the wiring portions and the base member, and extending to cover the groove portion which is a region where the wiring portions are not arranged; and
   at least one light emitting element disposed straddling at least a part of the groove portion,
   the light-shielding member being made of a material that shields the base member from at least a specific wavelength of light emitted from the light emitting element.

2. The light emitting device according to claim 1, wherein: the base member is flexible.

3. The light emitting device according to claim 1, wherein: the light-shielding member is at least one of light-absorption materials, wavelength converting materials, and light-reflecting materials.

4. The light emitting device according to claim 1, further comprising:
   a reflecting layer disposed covering a portion of each of the wiring portions, and including a plurality of openings;
   the openings defined at least corresponding to the locations of the at least-one light emitting element, and arranged exposing parts of the wiring portions and the groove portions.

5. The light emitting device according to claim 4, further comprising:
   a resin layer arranged in each opening and around the light emitting element; and
   the adhesive agent having a lower optical transmittance than the resin layer to light from the light emitting element.

6. The light emitting device according to claim 1, wherein:
   the base member comprises at least one of polyimide (PI), polyethylene naphthalate (PEN), and polyethylene terephthalate (PET).

7. The light emitting device according to claim 3, wherein:
   the light-shielding member is carbon black.

8. The light emitting device according to claim 3, wherein:
   the light-shielding member includes a light-absorption material and a light-reflecting material.

9. The light emitting device according to claim 1, wherein:
   the light-shielding member is further configured to absorb the light emitted from the light emitting element and emit light of a different wavelength.

10. The light emitting device according to claim 1, further comprising:
    a plurality of groove portions defined between adjacent wiring portions.

11. The light emitting device according to claim 1, wherein:
    the adhesive agent substantially covers the base member.

12. The light emitting device according to claim 1, wherein the adhesive agent is made of resin.

* * * * *